United States Patent
Ho

(10) Patent No.: US 10,420,245 B2
(45) Date of Patent: Sep. 17, 2019

(54) CIRCUIT BOARD MODULE HAVING FLOATABLE CIRCUIT BOARD AND SERVER EQUIPPED WITH THE SAME

(71) Applicant: Wistron Corporation, New Taipei (TW)

(72) Inventor: Fong-Chi Ho, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/859,745

(22) Filed: Jan. 2, 2018

(65) Prior Publication Data
US 2019/0116682 A1    Apr. 18, 2019

(30) Foreign Application Priority Data

Oct. 13, 2017   (TW) .............................. 106215090 A

(51) Int. Cl.
| H05K 7/14 | (2006.01) |
| H01R 12/70 | (2011.01) |
| H05K 5/00 | (2006.01) |
| H05K 1/14 | (2006.01) |

(52) U.S. Cl.
CPC ....... *H05K 7/1487* (2013.01); *H01R 12/7005* (2013.01); *H05K 1/14* (2013.01); *H05K 5/0008* (2013.01); *H05K 5/0013* (2013.01); *H05K 7/1402* (2013.01); *H05K 7/1417* (2013.01); *H05K 7/1427* (2013.01); *H05K 2201/09063* (2013.01); *H05K 2201/10189* (2013.01); *H05K 2201/10409* (2013.01)

(58) Field of Classification Search
CPC ...... H05K 7/1487; H05K 1/14; H05K 5/0013; H05K 7/1417; H05K 7/1402; H05K 7/1427; H05K 5/0008; H05K 2201/09063; H05K 2201/10189; H05K 2201/10409; H01R 12/7005
See application file for complete search history.

(56) References Cited

U.S. PATENT DOCUMENTS

| 6,645,012 B2 * | 11/2003 | Ito ........................ | H01R 12/721 439/637 |
| 6,652,322 B2 * | 11/2003 | Ito ........................ | H01R 12/721 439/637 |
| 8,089,775 B2 * | 1/2012 | Matsuda ................. | H01L 23/13 361/736 |
| 9,972,928 B1 * | 5/2018 | Kanzaki ............. | H01R 12/7005 |

(Continued)

*Primary Examiner* — Binh B Tran
*Assistant Examiner* — Douglas R Burtner
(74) *Attorney, Agent, or Firm* — Winston Hsu

(57) ABSTRACT

A circuit board module includes a bracket, a first circuit board, a first resilient member and a second resilient member. The bracket has at least one protruding pillar. The first circuit board is disposed on the bracket. The first circuit board has at least one through hole and at least one first connector. The at least one protruding pillar passes through the at least one through hole. The at least one first connector defines an assembling direction. The first resilient member is disposed at a first side of the first circuit board. The first circuit board is configured to move in a first direction and compressing the first resilient member. The second resilient member is disposed at a second side of the first circuit board. The first circuit board is configured to move in a second direction and compressing the second resilient member.

18 Claims, 8 Drawing Sheets

(56) References Cited

U.S. PATENT DOCUMENTS

| | | | |
|---|---|---|---|
| 10,069,249 B2* | 9/2018 | Dai | H01R 9/035 |
| 10,191,510 B1* | 1/2019 | Bandoh | H01R 13/741 |
| 2007/0099663 A1* | 5/2007 | Li | H04B 1/3816 |
| | | | 455/558 |
| 2008/0248679 A1* | 10/2008 | Kuo | H05K 7/1417 |
| | | | 439/345 |
| 2010/0188828 A1* | 7/2010 | Takao | G06F 1/1613 |
| | | | 361/759 |
| 2010/0195304 A1* | 8/2010 | Takao | G06F 1/1616 |
| | | | 361/804 |
| 2015/0313035 A1* | 10/2015 | Kroeckel | H05K 1/117 |
| | | | 361/759 |
| 2017/0164487 A1* | 6/2017 | Kim | H05K 7/142 |
| 2017/0181309 A1* | 6/2017 | Yi | H05K 7/1417 |
| 2018/0270965 A1* | 9/2018 | Liu | H05K 5/0056 |
| 2019/0191573 A1* | 6/2019 | Araki | H05K 5/006 |

* cited by examiner

CIRCUIT BOARD MODULE HAVING FLOATABLE CIRCUIT BOARD AND SERVER EQUIPPED WITH THE SAME

BACKGROUND OF THE INVENTION

1. Field of the Invention

The invention relates to a circuit board module and a server and, more particularly, to a circuit board module and a server with a floatable circuit board.

2. Description of the Prior Art

A server is used to serve various computers or portable electronic devices in network system. In general, the server essentially consists of a framework and a plurality of machine cases disposed in the framework. A basic configuration of the machine case is similar to that of a personal computer including a central processing unit (CPU), a memory, an input/output (I/O) device, and so on. The machine case may be pulled out from the framework for performing maintenance or replacing components and may be pushed in and connected to the framework to operate normally. The machine case and the framework are connected to each other by connectors on their circuit boards correspondingly, so as to transmit signals with each other. However, the connectors of the machine case and the framework may not be aligned precisely due to the manufacturing and assembly tolerances of the machine case and the framework. Consequently, the connectors of the machine case and the framework may not be connected to or disconnected from each other smoothly and the server may not operate normally.

SUMMARY OF THE INVENTION

The invention provides a circuit board module and a server with a floatable circuit board, so as to solve the aforesaid problems.

According to an embodiment of the invention, a circuit board module comprises a bracket, a first circuit board, a first resilient member and a second resilient member. The bracket has at least one protruding pillar. The first circuit board is disposed on the bracket. The first circuit board has at least one through hole and at least one first connector. The at least one protruding pillar passes through the at least one through hole. The at least one first connector defines an assembling direction. The first resilient member is disposed at a first side of the first circuit board. The first circuit board is configured to move in a first direction and compress the first resilient member. The second resilient member is disposed at a second side of the first circuit board. The first circuit board is configured to move in a second direction and compress the second resilient member. The first side is opposite to the second side. The first direction is opposite to the second direction. The assembling direction is different from the first direction and the second direction.

According to another embodiment of the invention, a server comprises a casing, a circuit board module and a second circuit board. The circuit board module is disposed in the casing. The circuit board module comprises a bracket, a first circuit board, a first resilient member and a second resilient member. The bracket has at least one protruding pillar. The first circuit board is disposed on the bracket. The first circuit board has at least one through hole, at least one first connector and at least one guiding rod. The at least one protruding pillar passes through the at least one through hole. The at least one first connector defines an assembling direction. An extending direction of the at least one guiding rod is parallel to the assembling direction. The first resilient member is disposed at a first side of the first circuit board. The first circuit board is configured to move in a first direction and compress the first resilient member. The second resilient member is disposed at a second side of the first circuit board. The first circuit board is configured to move in a second direction and compress the second resilient member. The first side is opposite to the second side. The first direction is opposite to the second direction. The assembling direction is different from the first direction and the second direction. The second circuit board has at least one second connector and at least one guiding hole. The at least one second connector of the second circuit board is configured to be assembled to the at least one first connector of the first circuit board in the assembling direction.

As mentioned in the above, the invention disposes compressible resilient members at the periphery of the first circuit board of the circuit board module, such that the first circuit board of the circuit board module is floatable. The circuit board module of the invention may be disposed in the casing of the server and used to electrically connect the second circuit board. When the second connector of the second circuit board is assembled to the first connector of the first circuit board in the assembling direction, the manufacturing and assembly tolerances of the circuit board module can be absorbed by the compression of the resilient members. Accordingly, the second connector of the second circuit board can be connected to the first connector of the first circuit board completely, such that the server can operate normally.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
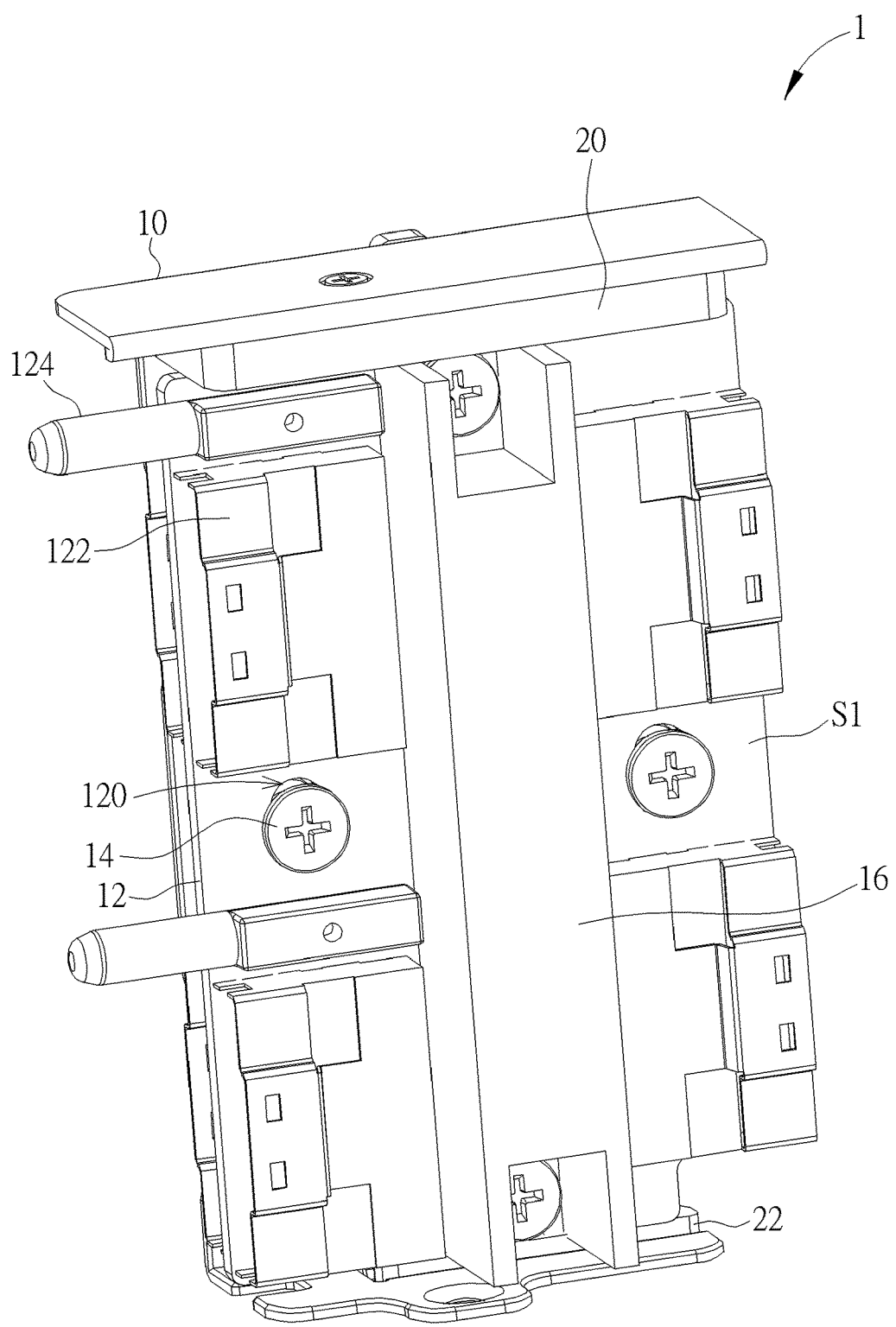
FIG. 1 is a perspective view illustrating a circuit board module according to an embodiment of the invention.
Figure 2:
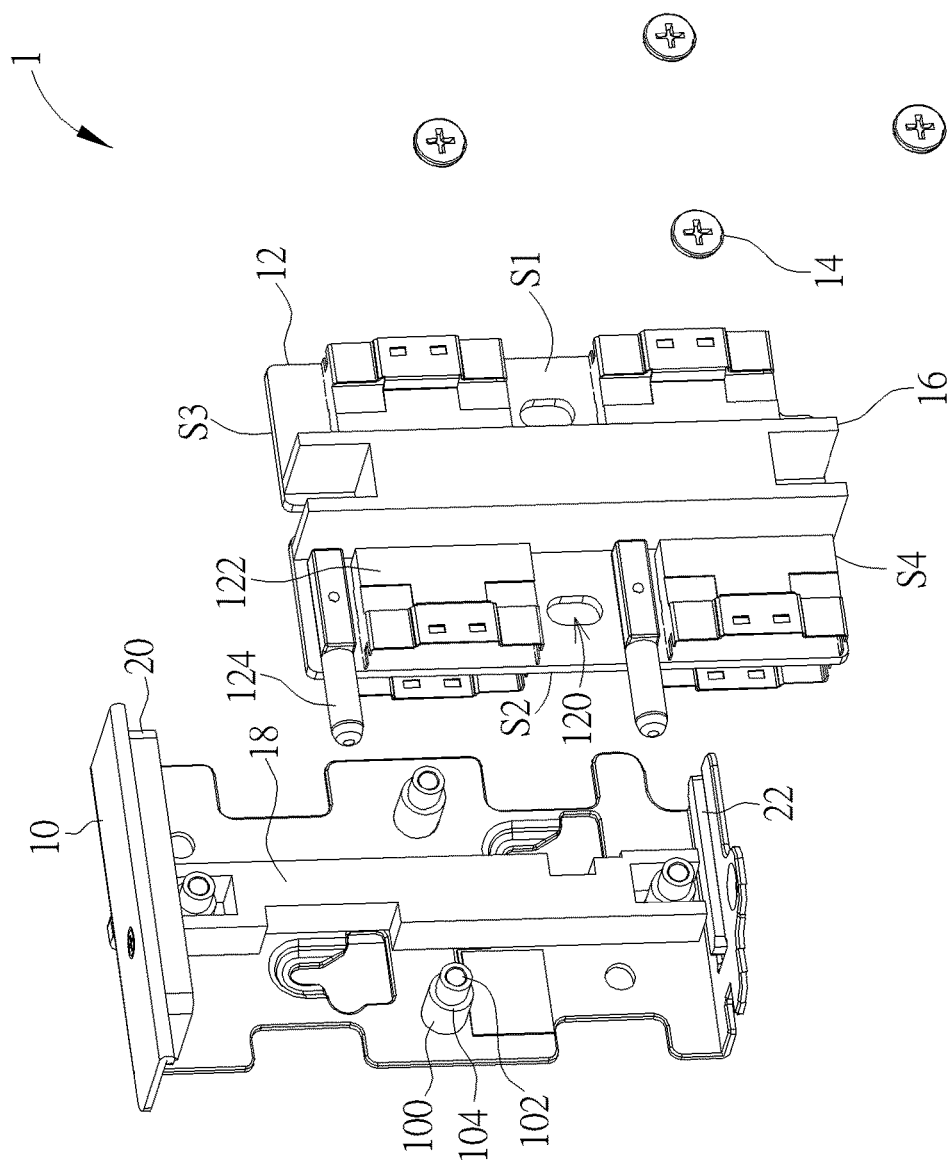
FIG. 2 is a partial exploded view illustrating the circuit board module shown in FIG. 1.
Figure 3:
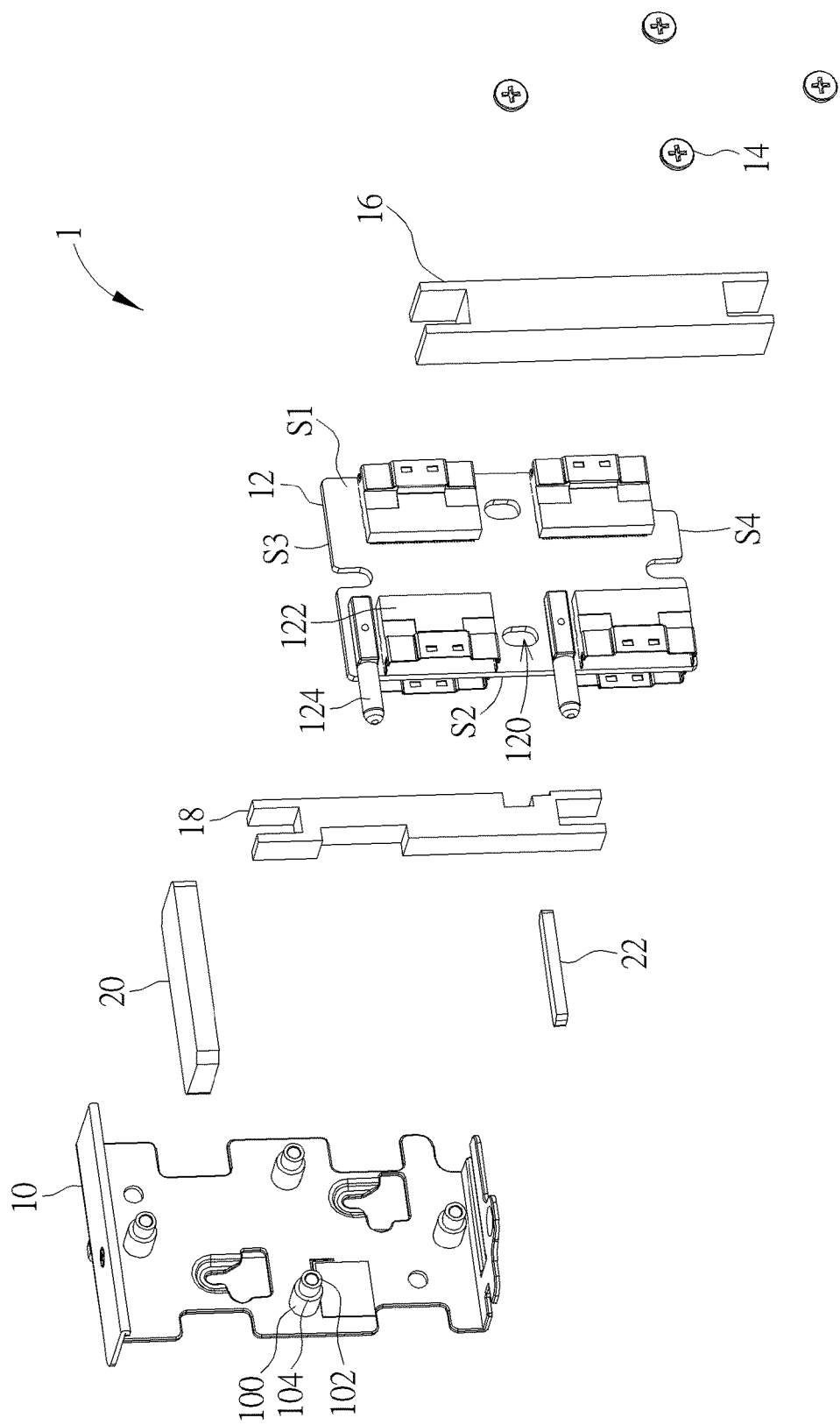
FIG. 3 is an exploded view illustrating the circuit board module shown in FIG. 1.
Figure 4:
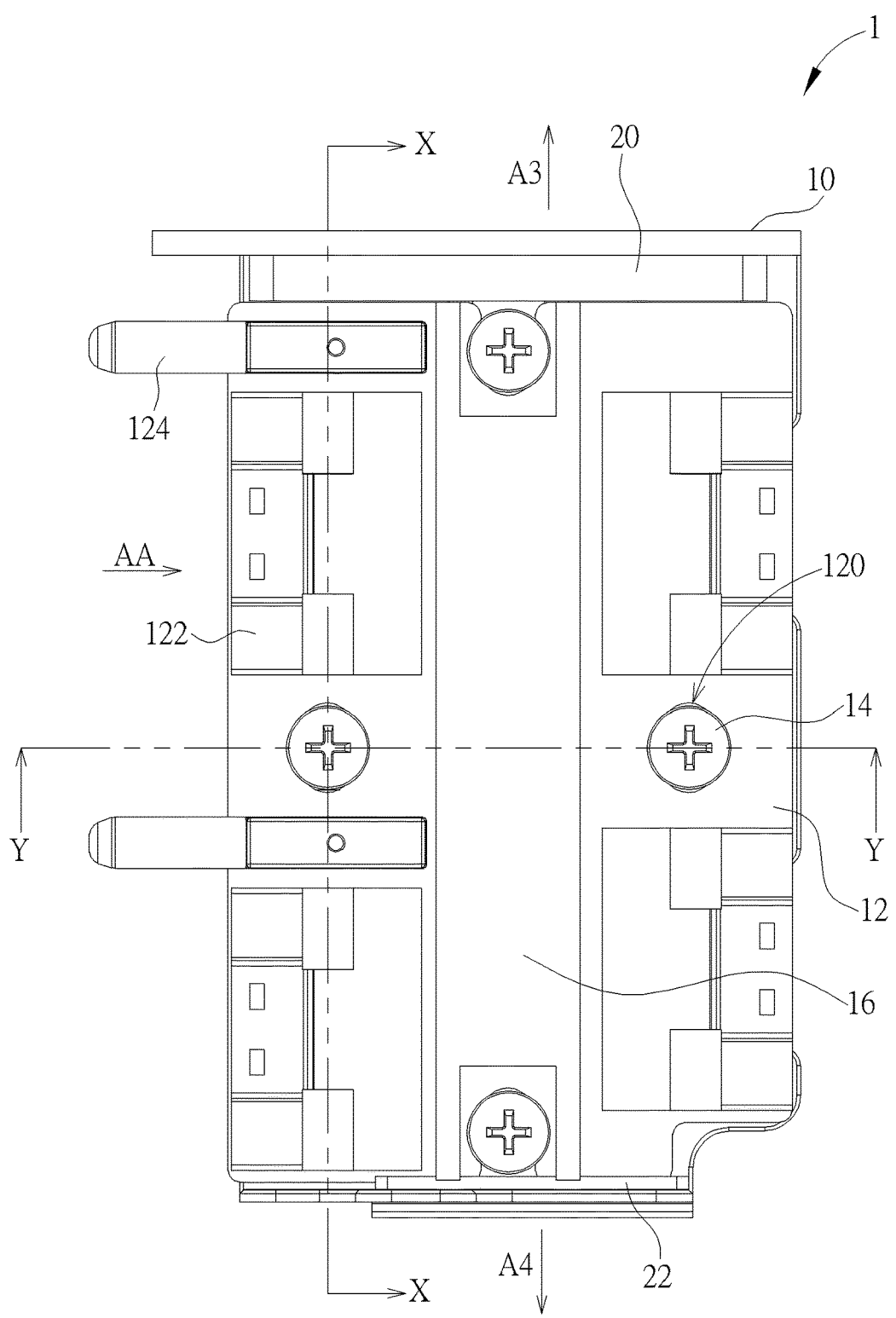
FIG. 4 is a front view illustrating the circuit board module shown in FIG. 1.
Figure 5:
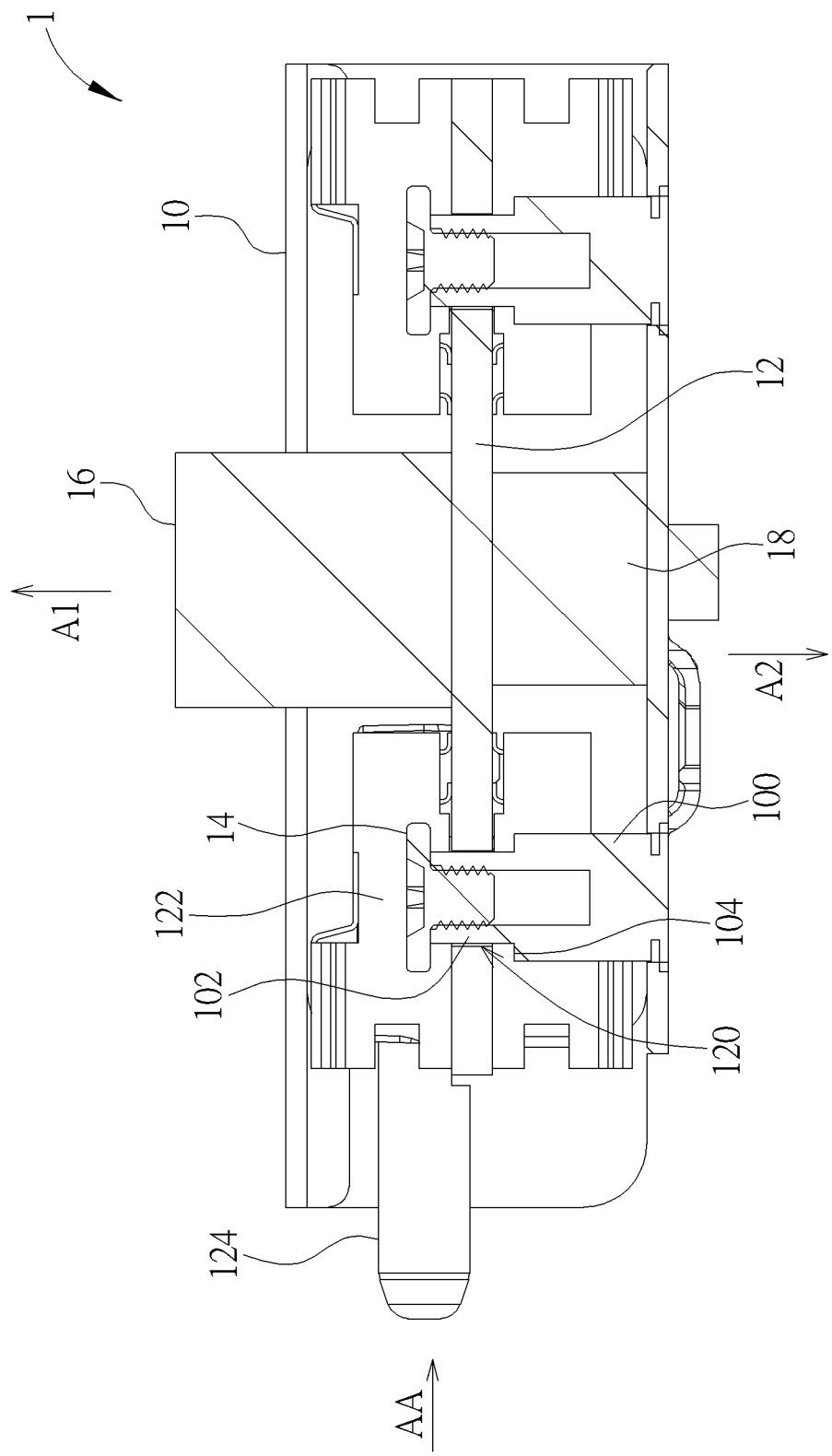
FIG. 5 is a sectional view illustrating the circuit board module along line X-X shown in FIG. 4.
Figure 6:
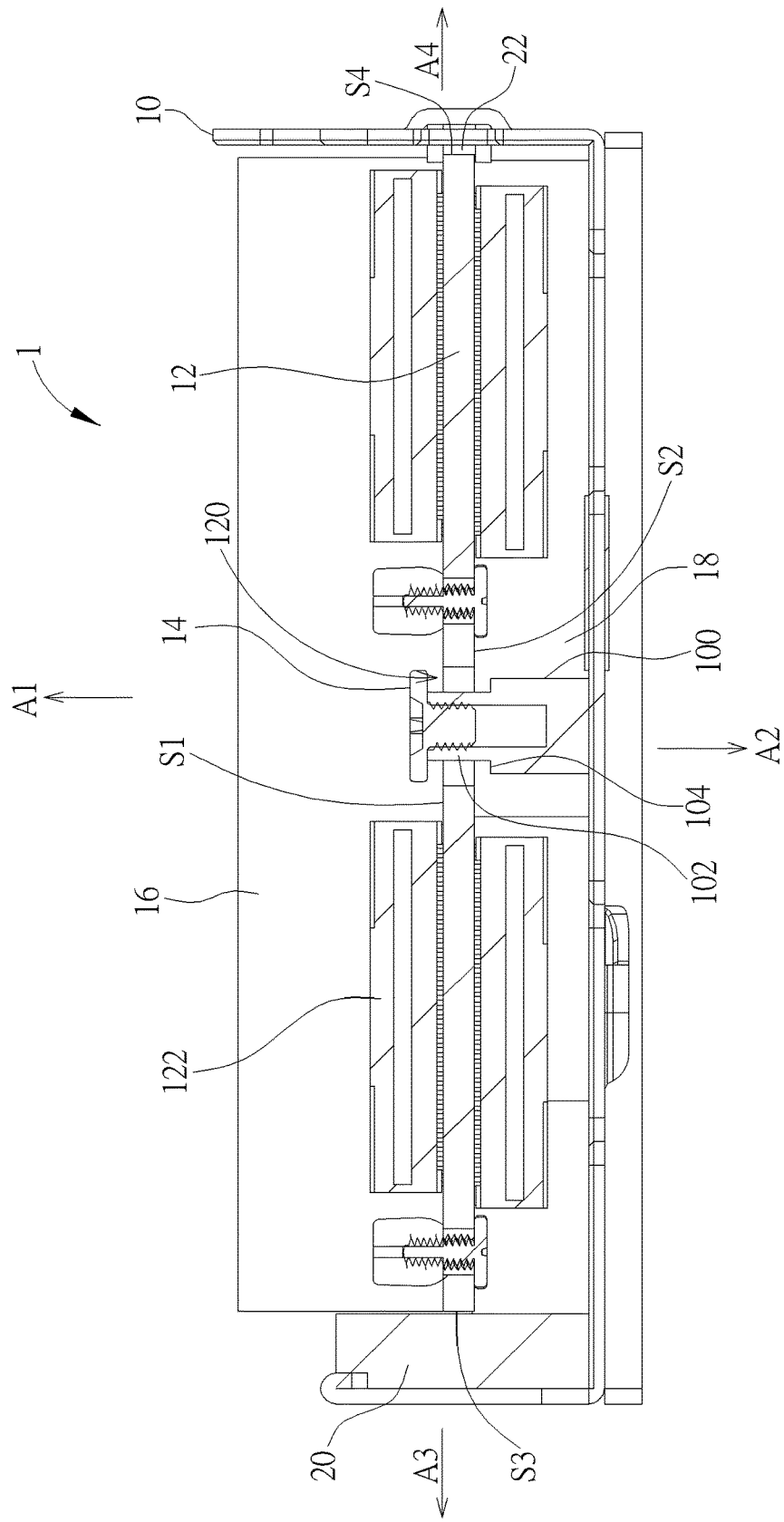
FIG. 6 is a sectional view illustrating the circuit board module along line Y-Y shown in FIG. 4.

Referring to FIGS. 1 to 6, FIG. 1 is a perspective view illustrating a circuit board module 1 according to an embodiment of the invention, FIG. 2 is a partial exploded view illustrating the circuit board module 1 shown in FIG. 1, FIG. 3 is an exploded view illustrating the circuit board module 1 shown in FIG. 1, FIG. 4 is a front view illustrating the circuit board module 1 shown in FIG. 1, FIG. 5 is a sectional view illustrating the circuit board module 1 along line X-X shown in FIG. 4, and FIG. 6 is a sectional view illustrating the circuit board module 1 along line Y-Y shown in FIG. 4.

As shown in FIGS. 1 to 6, the circuit board module 1 comprises a bracket 10, a first circuit board 12, at least one fixing member 14, a first resilient member 16, a second resilient member 18, a third resilient member 20 and a fourth resilient member 22. The bracket 10 has at least one protruding pillar 100, wherein the protruding pillar 100 has a fixing portion 102 and a restraining portion 104. The fixing portion 102 extends from the restraining portion 104 and a diameter of the fixing portion 102 is smaller than a diameter of the restraining portion 104. In this embodiment, the bracket 10 may be made of iron and the protruding pillar 100 may be a boss.

The first circuit board 12 is disposed on the bracket 10. The first circuit board 12 has at least one through hole 120, at least one first connector 122 and at least one guiding rod 124, wherein the at least one first connector 122 defines an assembling direction AA. The guiding rod 124 is adjacent to the first connector 122 and an extending direction of the guiding rod 124 is parallel to the assembling direction AA. It should be noted that the invention may dispose one or more first connectors 122 and one or more guiding rods 124 corresponding to the first connectors 122 on the first circuit board 12 according to practical applications. The protruding pillars 100 of the bracket 10 pass through the through holes 120 of the first circuit board 12, such that the first circuit board 12 is disposed on the bracket 10. The fixing members 14 are fixed on the fixing portions 102 of the protruding pillars 100 of the bracket 10. In this embodiment, the fixing members 14 are screws. It should be noted that the number of the fixing members 14, the protruding pillars 100 and the through holes 120 can be determined according to practical applications.

The first resilient member 16 is disposed at a first side S1 of the first circuit board 12, the second resilient member 18 is disposed at a second side S2 of the first circuit board 12, the third resilient member 20 is disposed at a third side S3 of the first circuit board 12, and the fourth resilient member 22 is disposed at a fourth side S4 of the first circuit board 12, wherein the first side S1 is opposite to the second side S2, the third side S3 is opposite to the fourth side S4, and the third side S3 and the fourth side S4 are different from the first side S1 and second side S2. In this embodiment, the third side S3 and the fourth side S4 connect the first side S1 and second side S2, but the invention is not so limited. In this embodiment, the first resilient member 16, the second resilient member 18, the third resilient member 20 and the fourth resilient member 22 may be sponges or other resilient members according to practical applications.

To assemble the circuit board module 1, the invention may attach the first resilient member to the first side S1 to the first circuit board 12 and attach the second resilient member 18, the third resilient member 20 and the fourth resilient member 22 to the bracket 10, as shown in FIG. 2. Then, the invention may make the fixing portions 102 of the protruding pillars 100 of the bracket 10 pass through the through holes 120 of the first circuit board 12, such that the second resilient member 18, the third resilient member 20 and the fourth resilient member 22 are attached to the second side S2, the third side S3 and the fourth side S4 of the first circuit board 12. Then, the invention may fix the fixing members 14 on the fixing portions 102 of the protruding pillars 100. Accordingly, the assembly of the circuit board module 1 is finished.

Since the first resilient member 16 is disposed at the first side S1 of the first circuit board 12, the first circuit board 12 is configured to move in a first direction A1 and compress the first resilient member 16. Since the second resilient member 18 is disposed at the second side S2 of the first circuit board 12, the first circuit board 12 is configured to move in a second direction A2 and compress the second resilient member 18. Since the third resilient member 20 is disposed at the third side S3 of the first circuit board 12, the first circuit board 12 is configured to move in a third direction A3 and compress the third resilient member 20. Since the fourth resilient member 22 is disposed at the fourth side S4 of the first circuit board 12, the first circuit board 12 is configured to move in a fourth direction A4 and compress the fourth resilient member 22. Accordingly, the first circuit board 12 is floatable. In this embodiment, the first direction A1 is opposite to the second direction A2, the third direction A3 is opposite to the fourth direction A4, and the third direction A3 and the fourth direction A4 are perpendicular to the first direction A1 and the second direction A2. In other words, the third direction A3 and the fourth direction A4 are different from the first direction A1 and the second direction A2. Furthermore, the assembling direction AA of the first connector 122 is perpendicular to the first direction A1 and the second direction A2, and the assembling direction AA of the first connector 122 is also perpendicular to the third direction A3 and the fourth direction A4. In other words, the assembling direction AA is different from the first direction A1 and the second direction A2, and the assembling direction AA is also different from the third direction A3 and the fourth direction A4.

As shown in FIG. 5, the movement of the first circuit board 12 in the first direction A1 is restrained by the fixing member 14 and the movement of the first circuit board 12 in the second direction A2 is restrained by the restraining portion 104 of the protruding pillar 100. Furthermore, the through hole 120 of the first circuit board 12 is a slotted hole and an extending direction of the slotted hole is parallel to the third direction A3 and the fourth direction A4. Accordingly, as shown in FIG. 6, the movement of the first circuit board 12 in the third direction A3 and the fourth direction A4 is restrained by opposite ends of the through hole 120.

Figure 7:
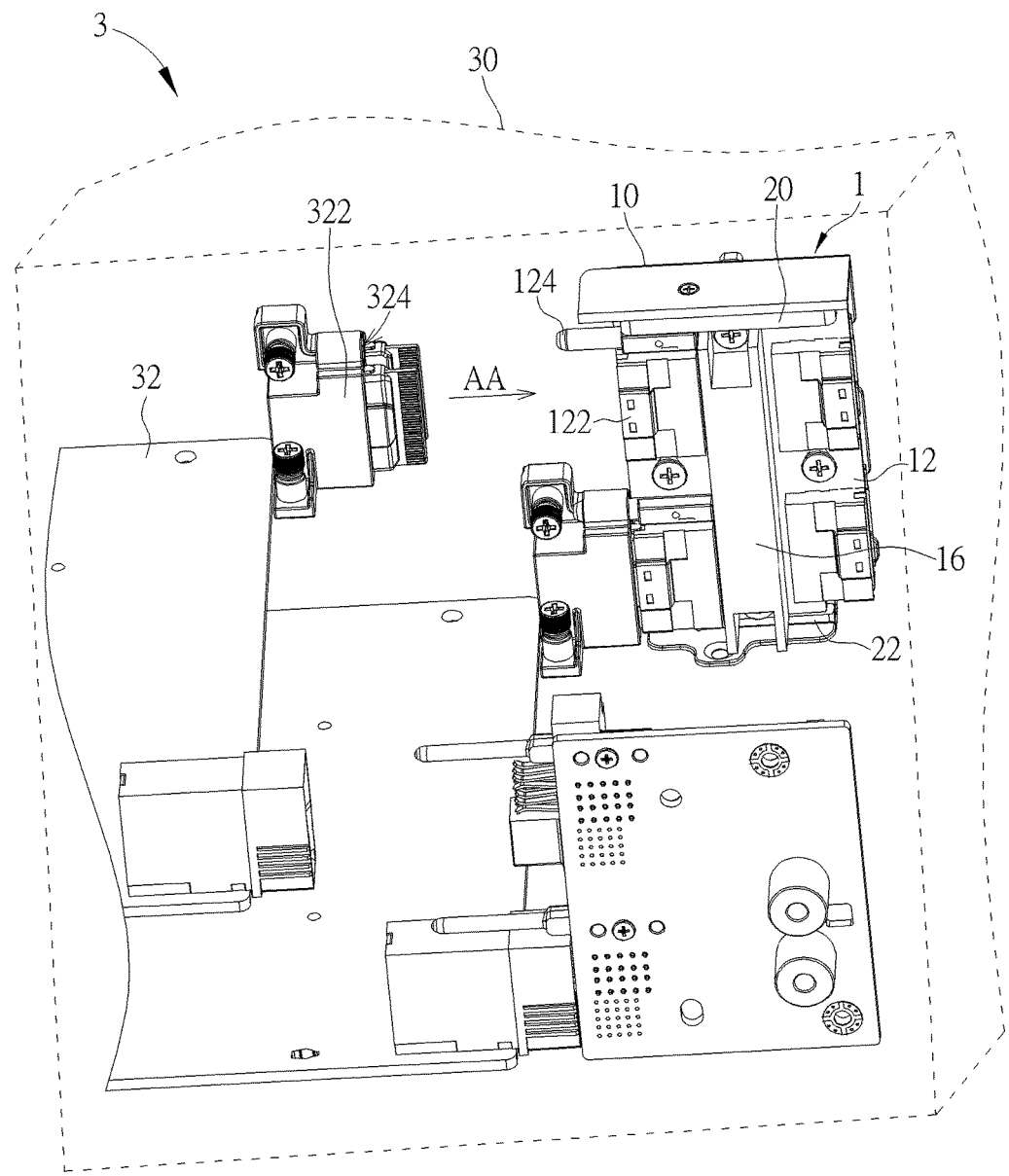
FIG. 7 is a partial perspective view illustrating a server according to an embodiment of the invention.
Figure 8:
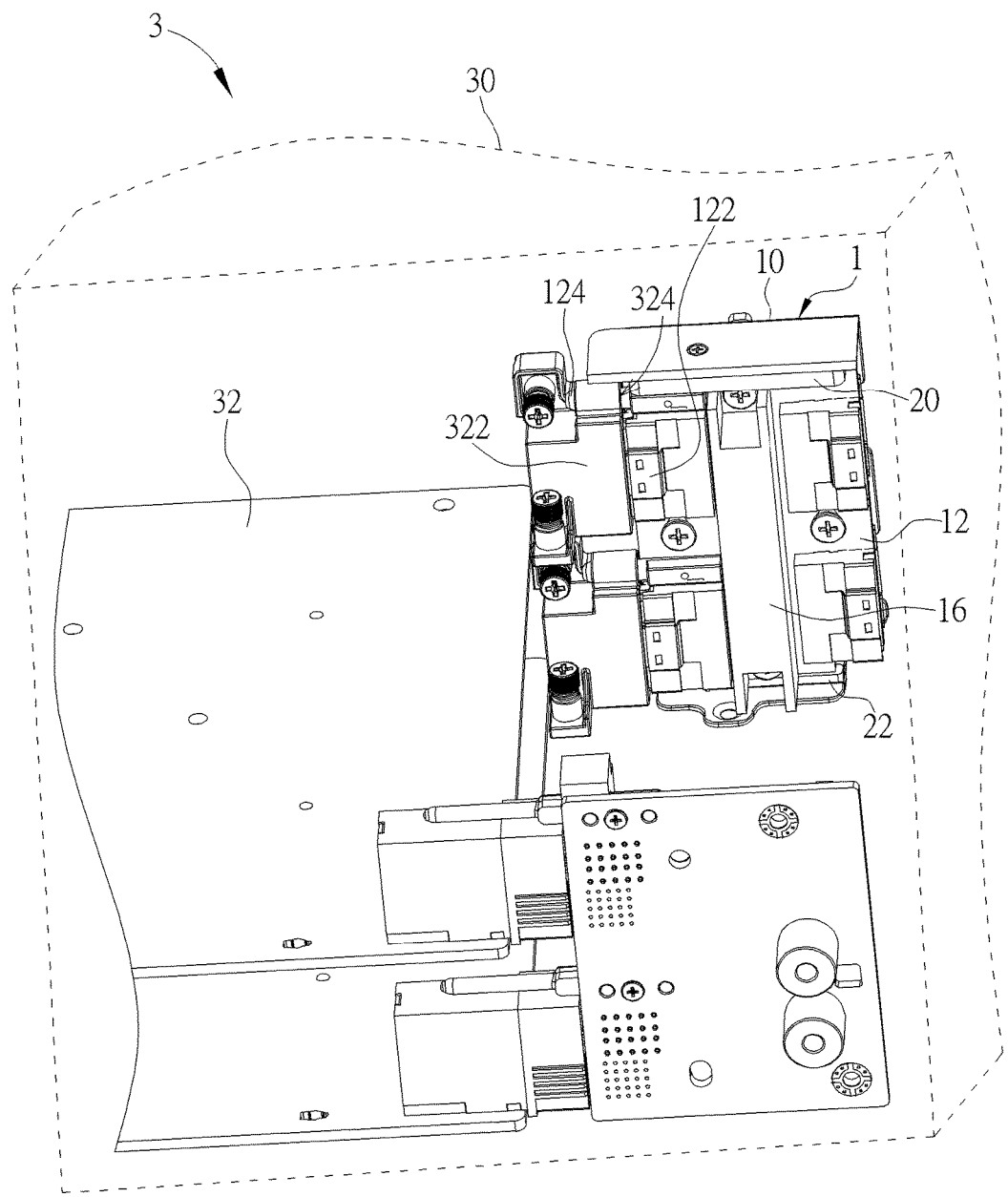
FIG. 8 is a perspective view illustrating the second connector assembled to the first connector shown in FIG. 7.

Referring to FIGS. 7 and 8, FIG. 7 is a partial perspective view illustrating a server 3 according to an embodiment of the invention and FIG. 8 is a perspective view illustrating the second connector 322 assembled to the first connector 122 shown in FIG. 7. As shown in FIGS. 7 and 8, the server 3 comprises a casing 30, the aforesaid circuit board module 1 and a second circuit board 32, wherein the second circuit board has at least one second connector 322 and at least one guiding hole 324. It should be noted that the casing 30 shown in FIGS. 7 and 8 is only a part of a complete casing of the server 3 and the casing 30 is illustrated by dotted line. The invention may dispose the circuit board module 1 in the casing 30 of the server 3. When the circuit board module 1 is disposed in the casing 30 of the server 3, the first resilient member 16 may abut against a fan casing or other components in the casing 30. In this embodiment, the second connector 322 of the second circuit board 32 may be assembled to the first connector 122 of the first circuit board 12 in the assembling direction AA. When the second connector 322 of the second circuit board 32 is assembled to the first connector 122 of the first circuit board 12 in the assembling direction AA, the guiding rod 124 and the guiding hole 324 may cooperate with each other to guide the second connector 322. It should be noted that the invention may dispose one or more second connectors 322 and one or more guiding holes 324 corresponding to the second connectors 322 on the second circuit board 32 according to the number of the first connectors 122 and the guiding rods 124 of the first circuit board 12. In this embodiment, the second circuit board 32 may be connected to the first circuit board 12 directly. In another embodiment, the second circuit board 32 may be disposed in an individual sub-casing and the sub-casing may be slidably disposed in the casing 30 by sliding groove and sliding rail, such that the second circuit board 32 is connected to the first circuit board 12.

When the manufacturing and assembly tolerances exist between the second connector 322 and the first connector 122 in the first direction A1, the manufacturing and assembly tolerances of the circuit board module 1 in the first direction A1 can be absorbed by the compression of the first resilient member 16. When the manufacturing and assembly tolerances exist between the second connector 322 and the first connector 122 in the second direction A2, the manufacturing and assembly tolerances of the circuit board module 1 in the second direction A2 can be absorbed by the compression of the second resilient member 18. When the manufacturing and assembly tolerances exist between the second connector 322 and the first connector 122 in the third direction A3, the manufacturing and assembly tolerances of the circuit board module 1 in the third direction A3 can be absorbed by the compression of the third resilient member 20. When the manufacturing and assembly tolerances exist between the second connector 322 and the first connector 122 in the fourth direction A4, the manufacturing and assembly tolerances of the circuit board module 1 in the fourth direction A4 can be absorbed by the compression of the fourth resilient member 22. Accordingly, the second connector 322 can be connected to the first connector 122 of the circuit board module 1 completely.

As mentioned in the above, the invention disposes compressible resilient members at the periphery of the first circuit board of the circuit board module, such that the first circuit board of the circuit board module is floatable. The circuit board module of the invention may be disposed in the casing of the server and used to electrically connect the second circuit board. When the second connector of the second circuit board is assembled to the first connector of the first circuit board in the assembling direction, the manufacturing and assembly tolerances of the circuit board module can be absorbed by the compression of the resilient members. Accordingly, the second connector of the second circuit board can be connected to the first connector of the first circuit board completely, such that the server can operate normally.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit board module comprising:
   a bracket having at least one protruding pillar;
   a first circuit board disposed on the bracket, the first circuit board having at least one through hole, at least one first connector and at least one guiding rod, the at least one protruding pillar passing through the at least one through hole, the at least one first connector defining an assembling direction, an extending direction of the at least one guiding rod being parallel to the assembling direction;
   a first resilient member disposed at a first side of the first circuit board, the first circuit board being configured to move in a first direction and compress the first resilient member; and
   a second resilient member disposed at a second side of the first circuit board, the first circuit board being configured to move in a second direction and compress the second resilient member, the first side being opposite to the second side, the first direction being opposite to the second direction, the assembling direction being different from the first direction and the second direction.

2. The circuit board module of claim 1, wherein the assembling direction is perpendicular to the first direction and the second direction.

3. The circuit board module of claim 1, further comprising:
   a third resilient member disposed at a third side of the first circuit board, the first circuit board being configured to move in a third direction and compress the third resilient member; and
   a fourth resilient member disposed at a fourth side of the first circuit board, the first circuit board being configured to move in a fourth direction and compress the fourth resilient member, the third side and the fourth side being different from the first side and second side, the third side being opposite to the fourth side, the third direction being opposite to the fourth direction, the assembling direction being different from the third direction and the fourth direction, the third direction and the fourth direction being different from the first direction and the second direction.

4. The circuit board module of claim 3, wherein the assembling direction is perpendicular to the third direction and the fourth direction, and the third direction and the fourth direction are perpendicular to the first direction and the second direction.

5. The circuit board module of claim 3, wherein the through hole is a slotted hole and an extending direction of the slotted hole is parallel to the third direction and the fourth direction.

6. The circuit board module of claim 1, wherein the at least one guiding rod is adjacent to the at least one first connector.

7. The circuit board module of claim 1, wherein each of the at least one protruding pillar further has a fixing portion and a restraining portion, and the fixing portion extends from the restraining portion and passes through the through hole.

8. The circuit board module of claim 7, further comprising at least one fixing member, the at least one fixing member being fixed on the fixing portion of the at least one protruding pillar.

9. The circuit board module of claim 1, further comprising a third resilient member and a fourth resilient member, the third resilient member being disposed at a third side of the first circuit board, the first circuit board being configured to move in a third direction and compress the third resilient member, the fourth resilient member being disposed at a fourth side of the first circuit board, the first circuit board being configured to move in a fourth direction and compress the fourth resilient member, the third side and the fourth side being different from the first side and second side, the third side being opposite to the fourth side, the third direction being opposite to the fourth direction, the assembling direction being perpendicular to the third direction and the fourth direction, the third direction and the fourth direction being perpendicular to the first direction and the second direction, the assembling direction being perpendicular to the first direction and the second direction.

10. A server comprising:
a casing;
a circuit board module disposed in the casing, the circuit board module comprising:
a bracket having at least one protruding pillar;
  a first circuit board disposed on the bracket, the first circuit board having at least one through hole, at least one first connector and at least one guiding rod, the at least one protruding pillar passing through the at least one through hole, the at least one first connector defining an assembling direction, an extending direction of the at least one guiding rod being parallel to the assembling direction;
  a first resilient member disposed at a first side of the first circuit board, the first circuit board being configured to move in a first direction and compress the first resilient member; and
  a second resilient member disposed at a second side of the first circuit board, the first circuit board being configured to move in a second direction and compress the second resilient member, the first side being opposite to the second side, the first direction being opposite to the second direction, the assembling direction being different from the first direction and the second direction; and
a second circuit board having at least one second connector and at least one guiding hole;
wherein the at least one second connector of the second circuit board is configured to be assembled to the at least one first connector of the first circuit board in the assembling direction; when the at least one second connector of the second circuit board is assembled to the at least one first connector of the first circuit board in the assembling direction, the at least one guiding rod and the at least one guiding hole cooperate with each other to guide the at least one second connector.

11. The server of claim 10, wherein the assembling direction is perpendicular to the first direction and the second direction.

12. The server of claim 10, wherein the circuit board module further comprises:
  a third resilient member disposed at a third side of the first circuit board, the first circuit board being configured to move in a third direction and compress the third resilient member; and
  a fourth resilient member disposed at a fourth side of the first circuit board, the first circuit board being configured to move in a fourth direction and compress the fourth resilient member, the third side and the fourth side being different from the first side and second side, the third side being opposite to the fourth side, the third direction being opposite to the fourth direction, the assembling direction being different from the third direction and the fourth direction, the third direction and the fourth direction being different from the first direction and the second direction.

13. The server of claim 12, wherein the assembling direction is perpendicular to the third direction and the fourth direction, and the third direction and the fourth direction are perpendicular to the first direction and the second direction.

14. The server of claim 12, wherein the through hole is a slotted hole and an extending direction of the slotted hole is parallel to the third direction and the fourth direction.

15. The server of claim 10, wherein the at least one guiding rod is adjacent to the at least one first connector.

16. The server of claim 10, wherein each of the at least one protruding pillar further has a fixing portion and a restraining portion, and the fixing portion extends from the restraining portion and passes through the through hole.

17. The server of claim 16, wherein the circuit board module further comprises at least one fixing member and the at least one fixing member is fixed on the fixing portion of the at least one protruding pillar.

18. The server of claim 10, wherein the circuit board module further comprises a third resilient member and a fourth resilient member, the third resilient member is disposed at a third side of the first circuit board, the first circuit board is configured to move in a third direction and compress the third resilient member, the fourth resilient member is disposed at a fourth side of the first circuit board, the first circuit board is configured to move in a fourth direction and compress the fourth resilient member, the third side and the fourth side are different from the first side and second side, the third side is opposite to the fourth side, the third direction is opposite to the fourth direction, the assembling direction is perpendicular to the third direction and the fourth direction, the third direction and the fourth direction are perpendicular to the first direction and the second direction, and the assembling direction is perpendicular to the first direction and the second direction.

* * * * *